(12) United States Patent
Tabata et al.

(10) Patent No.: US 9,018,824 B2
(45) Date of Patent: Apr. 28, 2015

(54) POWER GENERATING APPARATUS

(75) Inventors: Kunio Tabata, Shiojiri (JP); Noritaka Ide, Shiojiri (JP); Atsuya Hirabayashi, Chino (JP); Yasuhiro Ono, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 589 days.

(21) Appl. No.: 13/371,211

(22) Filed: Feb. 10, 2012

(65) Prior Publication Data

US 2012/0212101 A1 Aug. 23, 2012

(30) Foreign Application Priority Data

Feb. 17, 2011 (JP) ................................. 2011-031718

(51) Int. Cl.
*H01L 41/113* (2006.01)
*H02N 2/18* (2006.01)

(52) U.S. Cl.
CPC ............ *H02N 2/181* (2013.01); *H01L 41/1136* (2013.01); *H02N 2/186* (2013.01)

(58) Field of Classification Search
USPC .............................. 310/316.01, 317–319, 339
See application file for complete search history.

(56) References Cited

U.S. PATENT DOCUMENTS

| 5,552,656 | A | 9/1996 | Taylor |
| 5,801,475 | A | 9/1998 | Kimura |
| 6,252,336 | B1 | 6/2001 | Hall |
| 6,522,048 | B1 | 2/2003 | Burns et al. |
| 6,995,496 | B1 * | 2/2006 | Hagood et al. ................. 310/317 |
| 8,026,650 | B2 * | 9/2011 | Ramadass et al. ............ 310/318 |
| 8,368,290 | B2 * | 2/2013 | Kwon et al. .................. 310/339 |
| 8,373,332 | B2 * | 2/2013 | Lee ................................ 310/339 |
| 2010/0102782 | A1 | 4/2010 | Thiesen et al. |
| 2012/0119618 | A1 * | 5/2012 | Tabata et al. .................. 310/319 |
| 2012/0126666 | A1 * | 5/2012 | Tabata et al. .................. 310/319 |
| 2013/0082569 | A1 * | 4/2013 | Hirabayashi et al. ......... 310/319 |

FOREIGN PATENT DOCUMENTS

| JP | 07-107752 A | 4/1995 |
| JP | 2003-218418 A | 7/2003 |
| JP | 2012-152009 A | 8/2012 |

OTHER PUBLICATIONS

E. Lefeuvre et al., "A comparison between several vibration-powered piezoelectric generators for standalone systems", Sensors and Actuators A: Physical, vol. 126, Issue 2, Feb. 14, 2006, pp. 405-416.

* cited by examiner

*Primary Examiner* — Thomas Dougherty
(74) *Attorney, Agent, or Firm* — Maschoff Brennan

(57) ABSTRACT

A power-generating apparatus includes: a deformation member that is provided with a first piezoelectric device and deformed while switching a deformation direction; an amount of deformation detection unit that detects an amount of deformation of the deformation member; a pair of electrodes provided on the first piezoelectric device; a switch provided between the pair of electrodes; and a switch control unit that controls the switch to cause short-circuit between the pair of electrodes for a predetermined period when the amount of deformation is equal to or more than a predetermined amount.

12 Claims, 11 Drawing Sheets

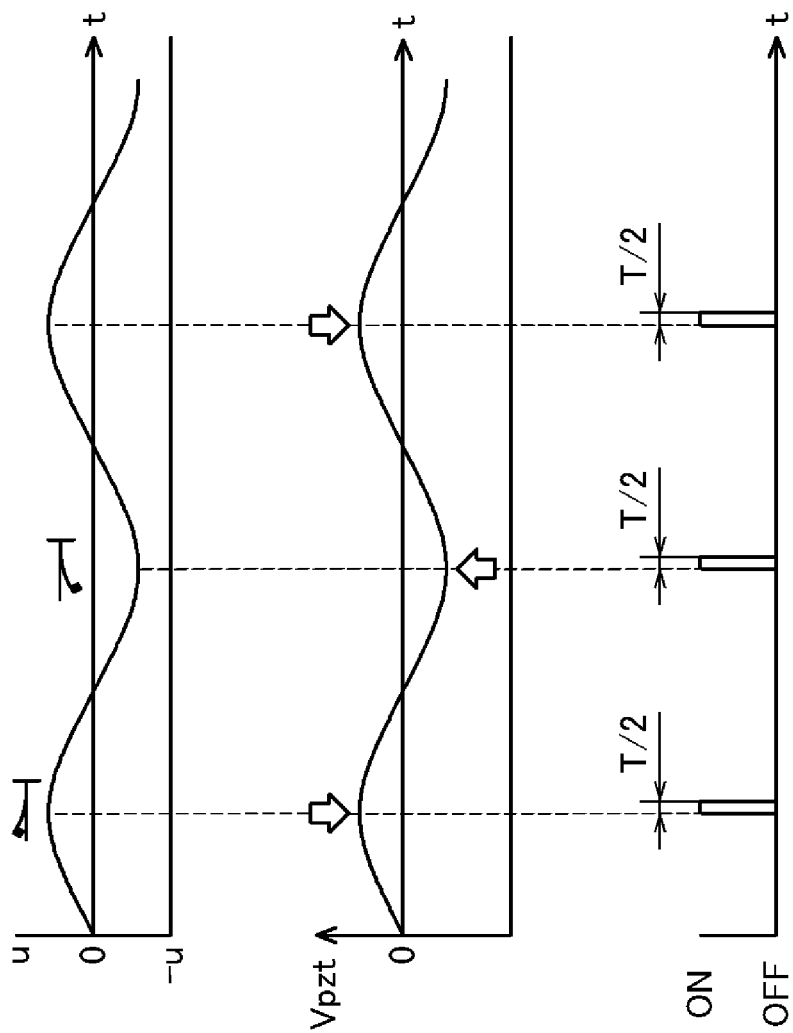

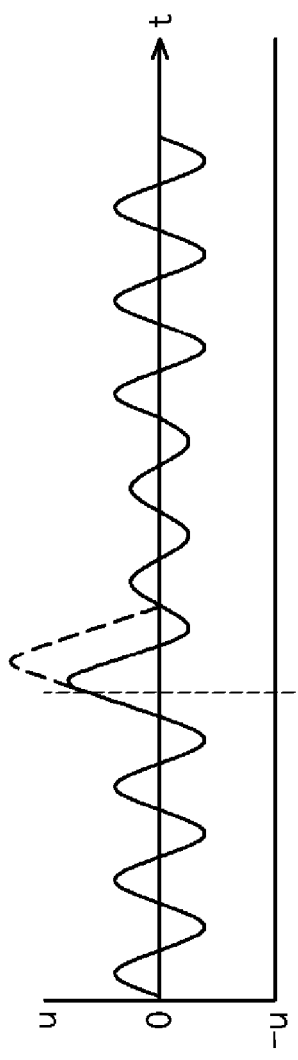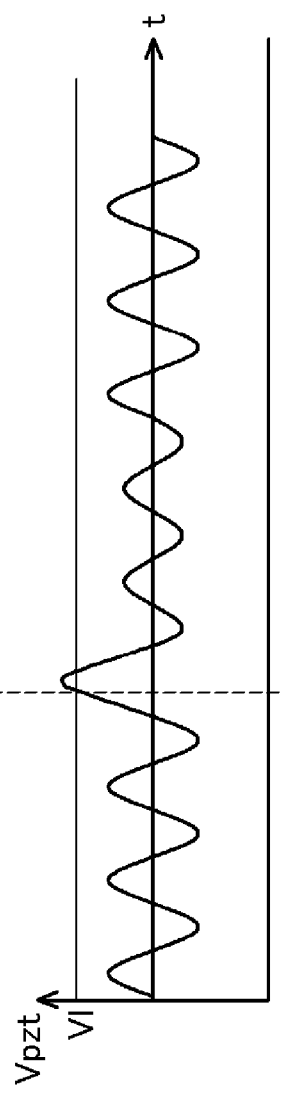
FIG. 7A
FIG. 7B
FIG. 7C

POWER GENERATING APPARATUS

BACKGROUND

1. Technical Field

The present invention relates to a power-generating apparatus that extracts electric charge generated when a piezoelectric material such as a piezoelectric device is deformed by external forces as an electric energy.

2. Related Art

When a piezoelectric material such as lead zirconate titanate (PZT), crystal ($SiO_2$), or zinc oxide (ZnO) is deformed by external forces, electric polarization is induced within the material and positive and negative electric charge appears on the surface. This phenomenon is the so-called piezoelectric effect. A power-generating method of vibrating a cantilever and repeatedly weighting the piezoelectric material and extracting the electric charge generated on the surface of the piezoelectric material as electricity using the property of the piezoelectric material has been proposed. For example, a technology of vibrating a metal cantilever formed by providing a weight on its end and bonding a thin plate of a piezoelectric material thereto, extracting positive and negative electric charge alternately generated in the piezoelectric material with the vibration and generating an alternating current, further, rectifying the alternating current by a diode, and then, accumulating it in a capacitor and extracting it as power has been proposed (Patent Document 1 (JP-A-7-107752)).

In a power-generating apparatus using the technology, when a force beyond the scope of the assumption acts on the cantilever and the cantilever excessively vibrates, the cantilever may collide with a surrounding member and break. In order to prevent that, a technology of relaxing the impact when the cantilever collides with the inner wall of a casing containing the cantilever by providing an elastic body on the inner wall of the casing has been proposed (Patent Document 2 (JP-A-2003-218418)).

However, there has been a problem that it is difficult to sufficiently downsize the power-generating apparatus because it is necessary to secure a space for providing the elastic body in the proposed technologies in related art.

SUMMARY

An advantage of some aspects of the invention is to provide a technology that can preferably downsize a power-generating apparatus containing a cantilever by suppressing excessive vibration of the cantilever.

A power-generating apparatus according to an aspect of the invention includes a deformation member that is provided with a first piezoelectric device and deformed while switching a deformation direction, an amount of deformation detection unit that detects an amount of deformation of the deformation member, a pair of electrodes provided on the first piezoelectric device, a switch provided between the pair of electrodes, and a switch control unit that controls the switch to cause short-circuit for a predetermined time between the pair of electrodes when the amount of deformation is equal to or more than a predetermined amount.

In the power-generating apparatus according to the aspect of the invention, since the first piezoelectric device is provided on the deformation member, when the deformation member is deformed, the first piezoelectric device is also deformed. As a result, positive and negative electric charge is generated by the piezoelectric effect in the first piezoelectric device. When the first piezoelectric device is repeatedly deformed with the deformation member, also the positive and negative electric charge is repeatedly generated and the electric charge is extracted as currents, and thereby, power is generated. Further, when the amount of deformation is equal to or more than the predetermined amount, short-circuit is caused between the pair of electrodes provided in the first piezoelectric device. According to the configuration, since the piezoelectric device is difficult to be deformed with the short-circuiting between the pair of electrodes, the deformation of the first piezoelectric device is suppressed. Thereby, an excessive deformation of the deformation member provided with the first piezoelectric device may be suppressed, and thus, it is not necessary to provide a member for relaxing the impulse at collision and the power-generating apparatus may be downsized.

In the above described power-generating apparatus according to the aspect of the invention, a second piezoelectric device used for detection of the amount of deformation may be provided on the deformation member, and the amount of deformation may be detected by detection of a voltage generated in the second piezoelectric device.

According to the configuration, since the second piezoelectric device is provided on the deformation member, the second piezoelectric device is also deformed according to the deformation of the deformation member. That is, in the second piezoelectric device, the voltage in response to the amount of deformation of the deformation member is generated. Therefore, the amount of deformation of the deformation member can be detected based on the voltage generated in the second piezoelectric device. The second piezoelectric device may be provided at the same step as the step of providing the first piezoelectric device, and thus, productivity can be improved.

Furthermore, in the above described power-generating apparatus according to the aspect of the invention, the following configuration may be employed. First, the first piezoelectric device connected to an inductor in series with a switch provided between the pair of electrodes so that the capacitance component of the first piezoelectric device and the inductor may form a resonance circuit. While the amount of deformation of the deformation member does not reach the predetermined amount, the switch may be connected when the deformation direction of the deformation member is switched and the switch may be disconnected after a time corresponding to a half period of the resonance period of the resonance circuit has lapsed.

An amount of generated electric charge of the first piezoelectric device becomes larger as the amount of deformation of the first piezoelectric device is larger. Further, the first piezoelectric device forms the resonance circuit with the inductor, and the switch is provided in the resonance circuit. The deformation of the deformation member is started under the condition that conduction at the switch is disconnected, and, when the amount of deformation takes an extreme value (that is, the deformation direction is switched), the switch is conducted. Since the first piezoelectric device is deformed with the deformation member and generates more electric charge with the larger amount of deformation, when the electric charge generated in the first piezoelectric device is the largest, the first piezoelectric device is connected to the inductor and forms the resonance circuit. Then, the electric charge that has been generated in the first piezoelectric device flows into the inductor. Since the first piezoelectric device and the inductor form the resonance circuit, the current flowing into the inductor is overshot and flows into the opposite terminal of the first piezoelectric device. In this period (i.e., the period until the electric charge flowing out from one terminal of the first piezoelectric device flows from the opposite terminal via the inductor into the first piezoelectric device again) is a half of the resonance period of the resonance circuit formed by the first piezoelectric device and the inductor. Therefore, if the switch is connected to form the resonance circuit when the deformation direction of the first piezoelectric device is switched, and then, the switch is disconnected after a time of a half of the resonance period, the locations of the positive and negative electric charge that has been generated within the first piezoelectric device before connection of the inductor may be reversed. Next, in turn, if the deformation member is deformed in the opposite direction, the first piezoelectric device is deformed in the opposite direction and electric charge is accumulated within the first piezoelectric device in the manner in which new electric charge generated by the piezoelectric effect is further accumulated from the condition in which the locations of the positive and negative electric charge are reversed. Further, since the generated voltage is also increased as the electric charge is accumulated within the first piezoelectric device, a higher voltage than the voltage generated by electric polarization of the piezoelectric material forming the first piezoelectric device may be generated without separately preparing a step-up circuit. Here, as described above, the switch is also connected at the time when the amount of deformation of the first piezoelectric device is suppressed. That is, by controlling the connection timing of the switch, the high voltage can be generated as described above in addition to the suppression of the amount of deformation of the first piezoelectric device.

BRIEF DESCRIPTION OF THE DRAWINGS

The invention will be described with reference to the accompanying drawings, wherein like numbers reference like elements.

FIGS. 5A to 5C are explanatory diagrams showing a reason why a switch can be controlled at appropriate times by detecting a voltage of a piezoelectric device used for control.

FIGS. 7A to 7C are explanatory diagrams showing suppression of a deformation of the piezoelectric device by short-circuiting when a voltage generated in the piezoelectric device used for control is equal to or more than a predetermined value.

DESCRIPTION OF EXEMPLARY EMBODIMENTS

Figure 1A:
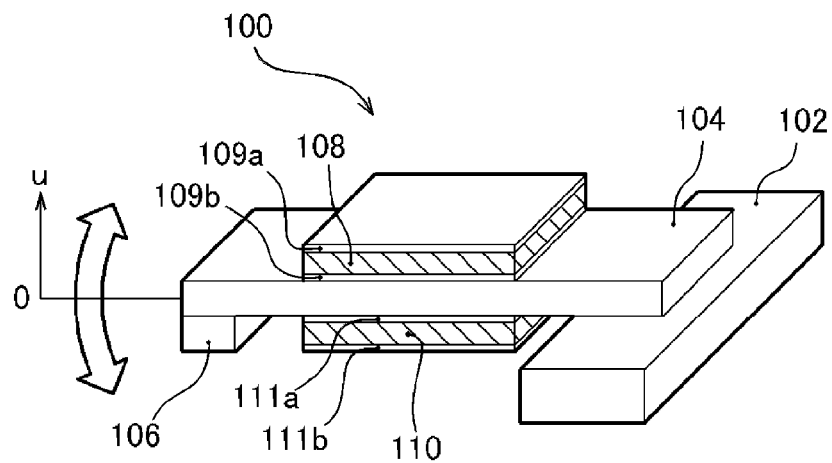
FIGS. 1A and 1B are explanatory diagrams showing a structure of a power-generating apparatus of an embodiment.
Figure 1B:
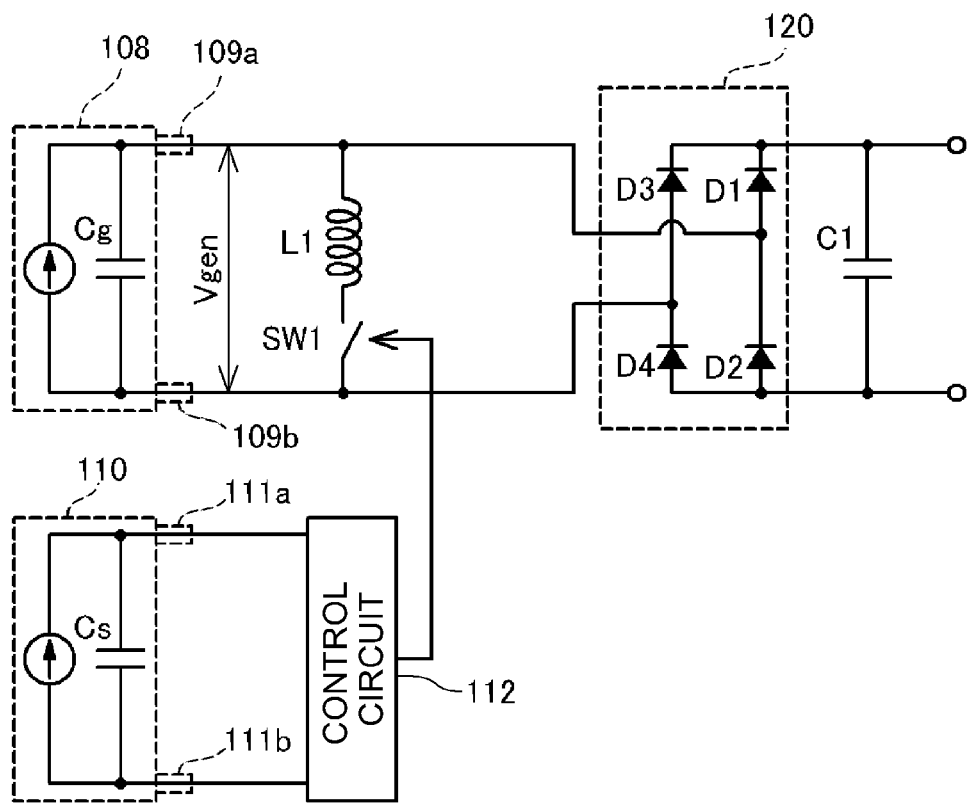

As below, for clarification of the above described subject matter of the invention, embodiments will be explained in the following order.
A. Embodiment
A-1. Structure of Power-Generating Apparatus
A-2. Operation of Power-Generating Apparatus
A-3. Operation Principle of Power-Generating Apparatus
A-4. Switching timing of Switch
B. First Modified Example
C. Second Modified Example A. Embodiment A-1. Structure of Power-Generating Apparatus FIGS. 1A and 1B are explanatory diagrams showing a structure of a power-generating apparatus 100 of an embodiment. FIG. 1A shows the structure of the power-generating apparatus 100, and FIG. 1B shows a circuit diagram. The structure of the power-generating apparatus 100 of the embodiment is a cantilever structure in which a beam 104 provided with a weight 106 is fixed to a support end 102. Further, a piezoelectric device 108 and a piezoelectric device 110 formed by piezoelectric materials such as lead zirconate titanate (PZT) is attached to the surface of the beam 104, and an upper electrode 109a and a lower electrode 109b (a pair of electrodes) formed by metal thin films are provided on the surface of the piezoelectric device 108. Furthermore, similarly, on the piezoelectric device 110, an upper electrode 111a and a lower electrode 111b formed by metal thin films are provided. In the example shown in FIG. 1A, the piezoelectric device 108 and the piezoelectric device 110 have the same shape, however, they may not necessarily have the same shape. For example, if the piezoelectric device 108 has the maximum length and width that can be provided on the beam 104, the amount of generated power of the piezoelectric device 108 becomes larger. On the other hand, the piezoelectric device 110 has the minimum width that can be provided (the length in the lateral direction of the beam 104), the displacement resistance of the beam 104 by the piezoelectric device 110 decreases and the power generation efficiency becomes better. Note that the piezoelectric device 108 and the piezoelectric device 110 are deformed due to a deformation of the beam 104, and the beam 104 corresponds to "deformation member" according to the invention.

Since the beam 104 is fixed to the support end 102 and the weight 106 is provided at the end side, when vibration is applied or the power-generating apparatus 100 moves, the end of the beam 104 largely vibrates as shown by a hollow arrow in the drawing. As a result, compression force and expansion force alternately act on the piezoelectric devices 108, 110 attached to the surfaces of the beam 104. Then, the respective piezoelectric device 108 and piezoelectric device 110 generate positive and negative electric charge and the electric charge appears in the upper electrodes 109a, 111a and the lower electrodes 109b, 111b.

FIG. 1B shows the circuit diagram of the power-generating apparatus 100 of the embodiment as an example. The piezoelectric device 108 may be represented as a current source and a capacitor Cg for accumulating electric charge. Similarly, the piezoelectric device 110 may be represented as a current source and a capacitor Cs for accumulating electric charge. Of them, to the piezoelectric device 108, an inductor L1 is connected in parallel and forms an electric resonance circuit with a capacitance component of the piezoelectric device 108. Further, a switch SW1 for turning ON/OFF of the resonance circuit is provided within the resonance circuit (in series with the inductor L1). ON/OFF of the switch SW1 is controlled by a control circuit 112 (corresponding to "switch control unit" according to the invention). Furthermore, the upper electrode 109a and the lower electrode 109b provided on the piezoelectric device 108 are connected to a full-wave rectifier circuit 120 including four diodes D1 to D4. In addition, a capacitor (output capacitor C1) that accumulates currents after rectification is connected to the full-wave rectifier circuit 120 for driving electric load.

On the other hand, the piezoelectric device 110 is provided for controlling the switch SW1, and the upper electrode 111a and the lower electrode 111b provided on the piezoelectric device 110 are connected to the control circuit 112. Therefore, as below, the piezoelectric device 108 may be referred to as "piezoelectric device for power generation" and the piezoelectric device 110 may be referred to as "piezoelectric device for control". The piezoelectric device 108 for power generation corresponds to "first piezoelectric device" according to the invention and the piezoelectric device 110 for control corresponds to "second piezoelectric device" according to the invention.

A-2. Operation of Power-Generating Apparatus

Figure 2A:
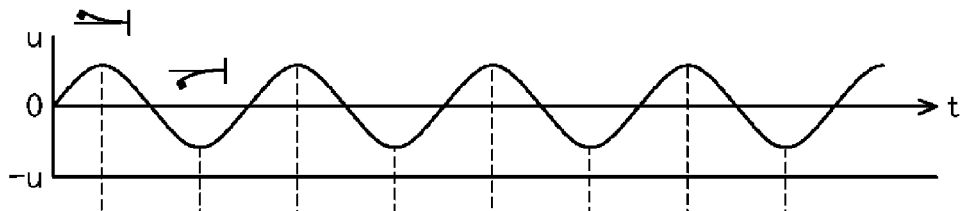
FIGS. 2A to 2D are explanatory diagrams showing an operation of the power-generating apparatus of the embodiment.
Figure 2B:
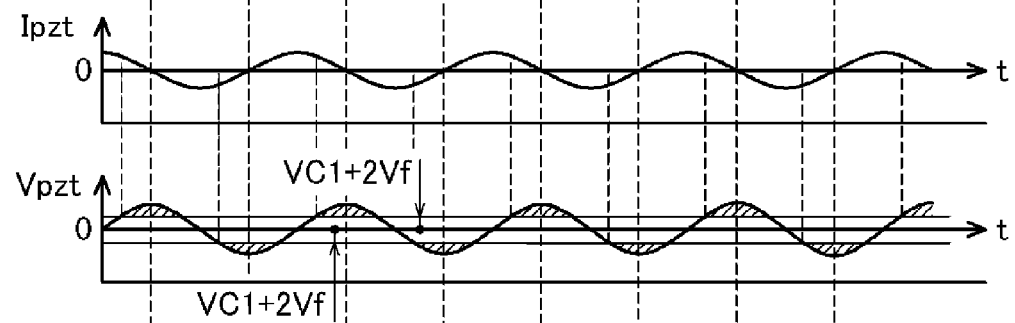

FIGS. 2A to 2D are explanatory diagrams showing an operation of the power-generating apparatus 100 of the embodiment. FIG. 2A shows changes of displacement u of the end of the beam 104 with vibration of the beam 104. The positive displacement u represents a state in which the beam 104 is warped upward (the upper surface side of the beam 104 is concaved) and the negative displacement (−u) represents a state in which the beam 104 is warped downward (the lower surface side of the beam 104 is concaved). Further, FIG. 2B shows a current generated by the piezoelectric device 108 with the deformation of the beam 104 and a resulting electromotive force generated within the piezoelectric device 108. Note that, in FIG. 2B, the generated electric charge in the piezoelectric device 108 is represented as an amount of electric charge generated per unit time (i.e., a current Ipzt), and the electromotive force generated in the piezoelectric device 108 is represented as a potential difference Vpzt generated between the upper electrode 109a and the lower electrode 109b.

Note that, as described above using FIGS. 1A and 1B, the piezoelectric device 110 is also provided on the beam 104, and, when the beam 104 is deformed, the piezoelectric device 110 is deformed like the piezoelectric device 108. Therefore, within the piezoelectric device 110, the current Ipzt and the potential difference Vpzt shown in FIG. 2B are also generated just like the piezoelectric device 108.

As shown in FIGS. 2A and 2B, while the displacement of the beam 104 increases, the piezoelectric device 108 generates a current in the positive direction (i.e., the current Ipzt takes a positive value), and accordingly, the potential difference Vpzt between the upper electrode 109a and the lower electrode 109b increases in the positive direction. If the potential difference Vpzt in the positive direction is larger than the sum of a voltage VC1 of the C1 and a double forward drop voltage Vf of the diode forming the full-wave rectifier circuit 120, i.e., VC1+2Vf, the electric charge generated afterward may be extracted as a direct current and accumulated in the output capacitor C1. Further, while the displacement of the beam 104 decreases, the piezoelectric device 108 generates a current in the negative direction (i.e., the current Ipzt takes a negative value), and accordingly, the potential difference Vpzt between the upper electrode 109a and the lower electrode 109b increases in the negative direction. If the potential difference Vpzt in the negative direction is larger than the sum of the VC1 and the 2Vf of the full-wave rectifier circuit 120, the generated electric charge may be extracted as a direct current and accumulated in the output capacitor C1. That is, even when the switch SW1 in FIG. 1B remains OFF, the electric charge may be accumulated in the output capacitor C1 with respect to the parts shown by shading in FIG. 2B.

Figure 2C:
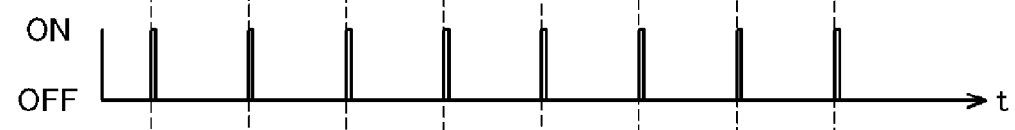
Figure 2D:
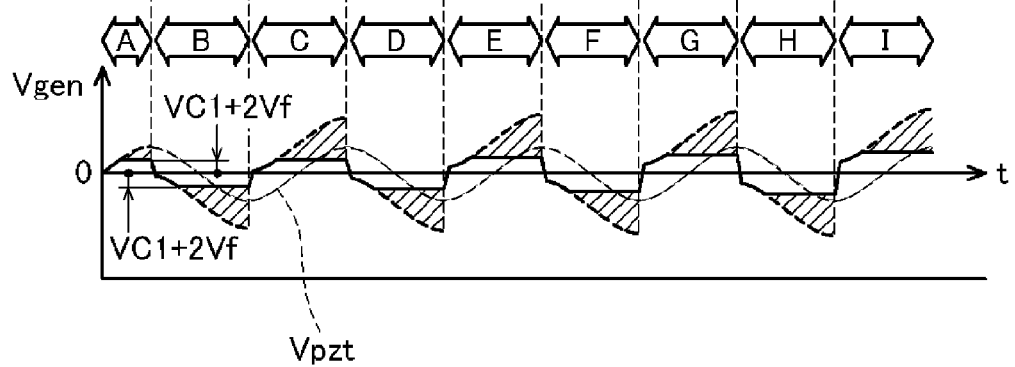

FIG. 2C shows times when the switch SW1 of the power-generating apparatus 100 of the embodiment is turned ON. Further, FIG. 2D shows a voltage between terminals Vgen of the piezoelectric device 108 when the switch SW1 operates. At the times shown in FIG. 2C, the switch SW1 is turned ON. Then, as shown by thick solid lines in FIG. 2D, when the switch SW1 is turned ON, inversion of the potential between terminals of the piezoelectric device 108 occurs. For example, in a period B indicated by "B" in FIG. 2D, when the switch SW1 is turned ON, the voltage between terminals of the piezoelectric device 108 is inverted toward the negative direction, and then, a voltage waveform shown by a thick broken line appears between the terminals of the piezoelectric device 108. The reason for the phenomenon will be described later. Further, in a period C indicated by "C" in FIG. 2D, the voltage between terminals of the piezoelectric device 108 is inverted toward the positive direction, and then, a voltage waveform shown by a thick broken line appears. With respect to the subsequent period D, period E, period F, etc., similarly, the voltage between terminals of the piezoelectric device 108 is inverted, and then, voltage waveforms shown by thick broken lines appear. Further, in the parts in which the voltage waveforms of the piezoelectric device 108 exceed the sum of the VC1 and the 2Vf (the parts shown by shading in FIG. 2D), the electric charge generated in the piezoelectric device 108 may be accumulated in the output capacitor C1. Note that, as a result of the electric charge flowing from the piezoelectric device 108 to the output capacitor C1, the voltage between the terminals of the piezoelectric device 108 is clipped at the voltage of the sum of the VC1 and the 2Vf. In other words, the voltage between the terminals of the piezoelectric device 108 is held at the voltage of the sum of the VC1 and the 2Vf. As a result, the voltage waveform between the upper electrode 109a and the lower electrode 109b is the waveform shown by the thick solid line in FIG. 2D.

As clearly known from comparison between the case where the switch SW1 remains OFF as shown in FIG. 2B and the case where the switch SW1 is turned on at the time when the deformation direction of the beam 104 is switched as shown in FIG. 2D, in the power-generating apparatus 100 of the embodiment, by turning the switch SW1 ON at appropriate times, the electric charge may efficiently be accumulated in the output capacitor C1. Accordingly, in the power-generating apparatus 100 of the embodiment, the piezoelectric device 110 used for control is provided for turning the switch SW1 ON at appropriate times, and the switch SW1 is controlled by detecting the voltage of the piezoelectric device 110. The detailed explanation will be made later on this point.

Further, when the electric charge is accumulated in the output capacitor C1 and the voltage between terminals of the output capacitor C1 increases, the amount of shift of the voltage waveform becomes larger accordingly. For example, in comparison between the period B in FIG. 2D (no electric charge is accumulated in the output capacitor C1) and the period H in FIG. 2D (a small amount of electric charge is accumulated in the output capacitor C1), the amount of shift of the voltage waveform is larger in the period H. Similarly, in comparison between the period C and the period I in FIG. 2D, the amount of shift of the voltage waveform is larger in the period I in which the amount of electric charge accumulated in the output capacitor C1 is larger. The reason for the phenomenon will be described later, and, as a result, in the power-generating apparatus 100 of the embodiment, by deforming the piezoelectric device 108, the voltage equal to or more than the voltage Vpzt generated between the upper electrode 109a and the lower electrode 109b may be accumulated in the piezoelectric device 110. Accordingly, it is not necessary to provide a special step-up circuit, and a small and high-efficiency power-generating apparatus can be obtained.

A-3. Operation Principle of Power-Generating Apparatus

Figure 3A:
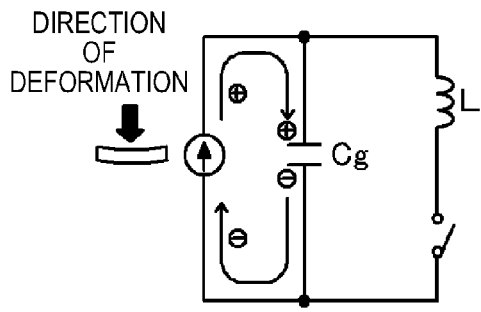
FIGS. 3A to 3F are explanatory diagrams conceptually showing the first half of an operation principle of the power-generating apparatus of the embodiment.

FIGS. 3A to 3F are explanatory diagrams conceptually showing the first half of an operation principle of the power-generating apparatus 100 of the embodiment. Further, FIGS. 4A to 4F are explanatory diagrams conceptually showing the second half of the operation principle of the power-generating apparatus 100 of the embodiment. FIGS. 3A to 4F conceptually show the movements of the electric charge within the Cg (the capacitance component of the piezoelectric device 108) when the switch SW1 is turned ON according to the deformation of the piezoelectric device 108. FIG. 3A shows a state in which the piezoelectric device 108 (exactly, the beam 104) is deformed upward (the upper surface side is concaved). When the piezoelectric device 108 is deformed upward, a current in the positive direction flows from the current source, the electric charge is accumulated in the Cg (the capacitance component of the piezoelectric device 108), and a voltage in the positive direction is generated as the Vgen. The voltage value increases as the amount of deformation of the piezoelectric device 108 is larger. Then, at the time when the amount of deformation of the piezoelectric device 108 takes an extreme value (the time when the amount of electric charge takes an extreme value (see FIG. 3B)), the switch SW1 is turned ON.

Figure 3F:
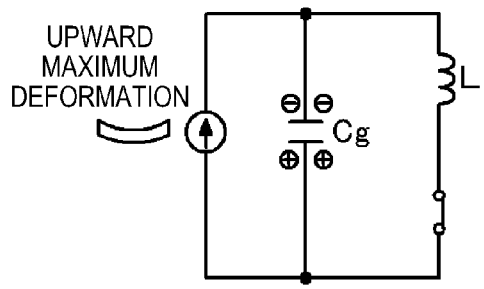
Figure 3B:
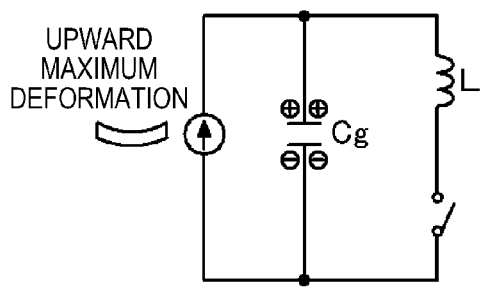
Figure 3E:
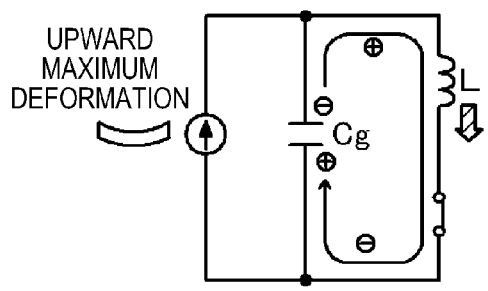
Figure 3C:
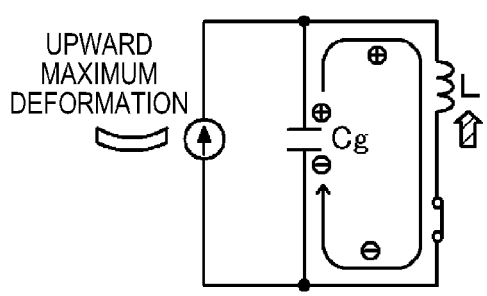

FIG. 3C shows a state immediately after the switch SW1 is turned ON. The electric charge has been accumulated in the Cg (the capacitance component of the piezoelectric device 108), and the electric charge tends to flow into the inductor L. When a current flows in the inductor L, magnetic flux is generated (magnetic flux increases), and the inductor L has a property of generating a back electromotive force in a direction in which the change of the magnetic flux is hindered (self-induction action). At the moment when the switch SW1 is turned ON, the electric charge flows and the magnetic flux tends to increase, and thus, the back electromotive force is generated in the direction in which the increase in the magnetic flux is hindered (in other words, in the direction in which the flow of the electric charge is hindered). Further, the magnitude of the back electromotive force is proportional to the rate of change of the magnetic flux (the amount of change per unit time). In FIG. 3C, the back electromotive force generated in the inductor L is shown by a shaded arrow. Because of the generation of the back electromotive force, even when the switch SW1 is turned ON, the electric charge of the piezoelectric device 108 flows out only little by little. That is, the current flowing in the inductor L increases only little by little.

Figure 3D:
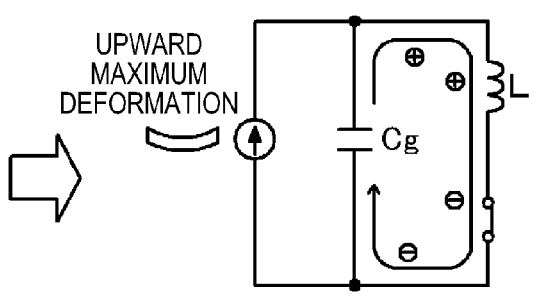

Then, the current flowing in the inductor L achieves a peak, the rate of change of the magnetic flux becomes "0", and thus, the back electromotive force becomes "0" as shown in FIG. 3D. Next, in turn, the current starts to decrease. Then, the magnetic flux penetrating the inductor L decreases, and an electromotive force in a direction in which the decrease of the magnetic flux is hindered (a direction for flowing the current) is generated (FIG. 3E). As a result, the current continues to flow in the inductor L while extracting the electric charge from the Cg (the capacitance component of the piezoelectric device 108) by the electromotive force. Unless loss is generated in the middle of the movement of the electric charge, all of the electric charge generated due to the deformation of the piezoelectric device 108 moves and the condition in which the positive and negative electric charge is exchanged (that is, the condition in which the positive electric charge is distributed at the lower surface side and the negative electric charge is distributed at the upper surface side of the piezoelectric device 108) is obtained. FIG. 3F shows a state in which all of the positive and negative electric charge generated due to the deformation of the piezoelectric device 108 has moved.

If the switch SW1 remains ON as it is, in turn, the reverse phenomenon to the above described phenomenon occurs. That is, the positive electric charge at the lower surface side of the piezoelectric device 108 tends to flow into the inductor L, and a back electromotive force in a direction in which the flow of the electric charge is hindered is generated in the inductor L. Then, the current flowing in the inductor L achieves a peak, the current decreases, and then, an electromotive force in a direction in which the decrease of the current is hindered (a direction to continue flowing the current) is generated in the inductor L. As a result, a condition in which all of the positive electric charge that had been at the lower surface side of the piezoelectric device 108 has moved to the upper surface side (the state shown in FIG. 3B) is obtained. The positive electric charge that has returned to the upper surface side of the piezoelectric device 108 moves to the lower surface side again in the manner as described above using FIG. 3B to FIG. 3F.

In the above described manner, when the switch SW1 is turned ON with the electric charge accumulated in the Cg (the capacitance component of the piezoelectric device 108) and the state is held, a kind of resonance phenomenon in which the direction of the current is alternately reversed between the piezoelectric device 108 and the inductor L occurs. Further, the period of the resonance phenomenon is a period T of the so-called LC resonance circuit, and, with the magnitude of the Cg (the capacitance component of the piezoelectric device 108) (capacitance) as C and the magnitude of the induction component (inductance) of the inductor L as L, given by $T=2\pi(LC)^{0.5}$. Therefore, the time immediate after the switch SW1 is turned ON (the state shown in FIG. 3C) to the state shown in FIG. 3F is T/2.

Figure 4A:
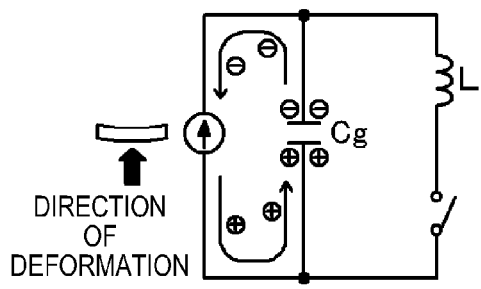
FIGS. 4A to 4F are explanatory diagrams conceptually showing the second half of the operation principle of the power-generating apparatus of the embodiment.
Figure 4F:
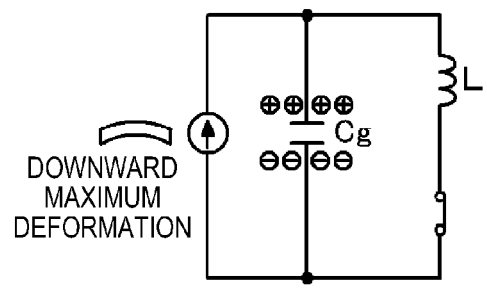
Figure 4B:
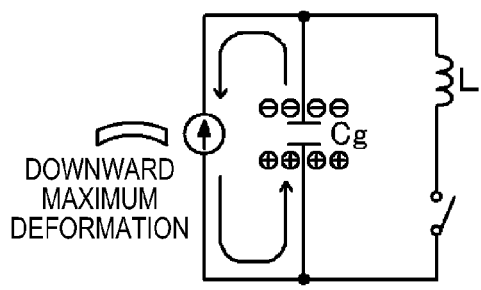
Figure 4E:
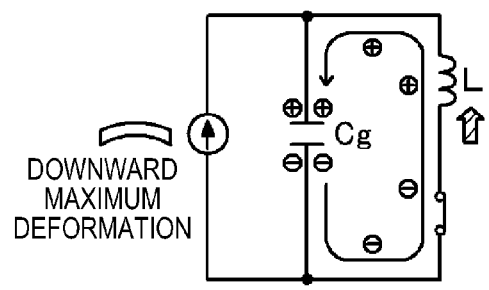
Figure 4C:
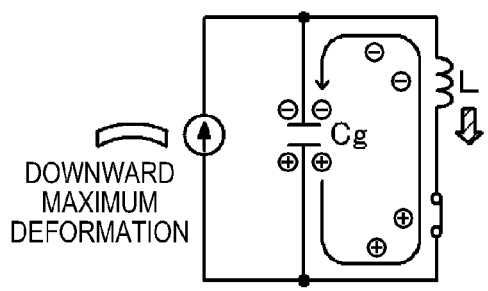
Figure 4D:
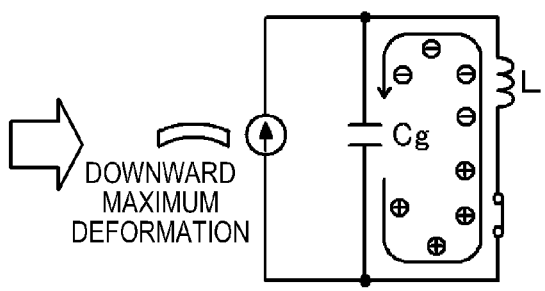

Accordingly, after T/2 has passed since the switch SW1 is turned ON, the switch SW1 is turned OFF as shown in FIG. 4A. Next, in turn, from the state, the piezoelectric device 108 (exactly, the beam 104) is deformed downward (the lower surface side is concaved). In the above described FIG. 3A, the piezoelectric device 108 has been deformed upward, however, the device is deformed downward in FIG. 4A, and thus, a current in the negative direction flows from the current source, the electric charge is accumulated in the Cg so that the Vgen is larger toward the negative direction. Further, as described above using FIGS. 3A to 3F, before the downward deformation of the piezoelectric device 108 (exactly, the beam 104), the positive electric charge is distributed at the lower surface side of the piezoelectric device 108 and the negative electric charge is distributed at the upper surface side, and thus, new positive charge is accumulated at the lower surface side and new negative electric charge is accumulated at the upper surface side in addition to that electric charge. FIG. 4B shows a state in which new electric charge has been accumulated in the piezoelectric device 108 by the deformation of the piezoelectric device 108 (exactly, the beam 104) with the switch SW1 held OFF.

Then, when the switch SW1 is turned ON at the time when the amount of deformation of the piezoelectric device 108 takes an extreme value (the time when the amount of electric charge takes an extreme value), the positive electric charge that has been accumulated at the lower surface side of the piezoelectric device 108 tends to flow into the inductor L. Concurrently, a back electromotive force is generated in the inductor L (see FIG. 4C), a current starts to flow little by little, the current achieves peak before long, and then, decreases. Then, an electromotive force in a direction in which the decrease of the current is hindered (a direction for flowing the current) is generated in the inductor L (see FIG. 4E), the current continues to flow by the electromotive force, and finally, all of the positive electric charge that has been distributed at the lower surface side of the piezoelectric device 108 moves to the upper surface side and all of the negative electric charge that has been distributed at the upper surface side moves to the lower surface side (see FIG. 4F). Further, the time for all of the positive electric charge at the lower surface side to move to the upper surface side and all of the negative electric at the upper surface side to move to the lower surface side is time T/2 corresponding to a half period of the LC resonance circuit. Accordingly, after the time T/2 has passed since the switch SW1 is turned ON, the switch SW1 is turned OFF and the piezoelectric device 108 (exactly, the beam 104) is deformed upward (the upper surface side is concaved), and thereby, positive and negative electric charge may be further accumulated within the piezoelectric device 108.

As explained above, in the power-generating apparatus 100 of the embodiment, the piezoelectric device 108 is deformed and electric charge is generated, and then, the piezoelectric device 108 is connected to the inductor L, the resonance circuit is formed in the period as the half of the period of the resonance period, and the distributions of the positive and negative electric charge within the piezoelectric device 108 are inverted. Next, in turn, the piezoelectric device 108 is deformed in the opposite direction and new electric charge is generated. Since the distributions of the positive and negative electric charge within the piezoelectric device 108 have been inverted, the newly generated electric charge is accumulated in the piezoelectric device 108. Subsequently, the piezoelectric device 108 is connected to the inductor L again in the period as the half of the period of the resonance period and the distributions of the positive and negative electric charge within the piezoelectric device 108 are inverted, and then, the piezoelectric device 108 is deformed in the opposite direction. By repeating the operation, the electric charge accumulated in the piezoelectric device 108 may be increased at each time when the piezoelectric device 108 is repeatedly deformed.

As described above using FIGS. 2A to 2D, in the power-generating apparatus 100 of the embodiment, a phenomenon that the voltage waveform between the terminals of the piezoelectric device 108 shifts occurs at each time when the switch SW1 is turned ON, and the phenomenon occurs according to the above described mechanism. That is, in the period A shown in FIG. 2D, a voltage is generated between the upper electrode 109a and the lower electrode 109b with the deformation of the piezoelectric device 108 (exactly, the beam 104), and the upper electrode 109a and the lower electrode 109b are connected to the full-wave rectifier circuit 120 and the electric charge of the parts exceeding the voltage of the sum of the VC1 and the 2Vf flows into the output capacitor C1 connected to the full-wave rectifier circuit 120. As a result, when the switch SW1 is turned ON at the time when the amount of deformation of the beam 104 takes an extreme value, the positive and negative electric charge left within the piezoelectric device 108 then moves via the inductor L, and the locations of the positive and negative electric charge within the piezoelectric device 108 are exchanged. Note that, as clearly known from the mechanism described above using FIGS. 3A to 4F, the period in which the switch SW1 is ON is the time as a half of the resonance period of the resonance circuit including the capacitance component of the piezoelectric device 108 and the inductor L.

Then, under the condition that the locations of the positive and negative electric charge have been exchanged, when the beam 104 is deformed in the opposite direction, the voltage waveform by the piezoelectric effect appears between the upper electrode 109a and the lower electrode 109b of the piezoelectric device 108. That is, under the condition that polarities of the upper electrode 109a and the lower electrode 109b of the piezoelectric device 108 have been exchanged, the voltage change due to the deformation of the piezoelectric device 108 occurs. As a result, in the period B shown in FIG. 2D, a voltage waveform like one formed by shifting the voltage waveform generated in the piezoelectric device 108 due to the deformation of the beam 104 appears. In this regard, as described above, the electric charge of the parts exceeding the voltage of the sum of the VC1 and the 2Vf flows into the output capacitor C1, and thus, the voltage between the upper electrode 109a and the lower electrode 109b of the piezoelectric device 108 is clipped at the voltage of the sum of the VC1 and the 2Vf. Then, when the switch SW1 is turned ON for the time of the half of the resonance period, the locations of the positive and negative electric charge left in the piezoelectric device 108 are exchanged. Then, the beam 104 is deformed from the condition, the voltage waveform by the piezoelectric effect appears in the piezoelectric device 108. Accordingly, also, in the period C shown in FIG. 2D, the voltage waveform like one formed by shifting the voltage waveform generated in the piezoelectric device 108 due to the deformation of the beam 104 appears.

Further, as described above using FIGS. 2A to 2D, in the power-generating apparatus 100 of the embodiment, a phenomenon that the amount of shift of the voltage waveform gradually becomes larger while the beam 104 is repeatedly deformed. Accordingly, a great advantage that the higher voltage than the potential difference generated between the upper electrode 109a and the lower electrode 109b by the piezoelectric effect of the piezoelectric device 108 may be accumulated in the output capacitor C1 can be obtained. This phenomenon occurs according to the following mechanism.

First, as shown in the period A or the period B in FIG. 2D, when the output capacitor C1 is not charged, if the voltage generated between the terminals of the piezoelectric device 108 exceeds the 2Vf of the full-wave rectifier circuit 120, the electric charge flows from the piezoelectric device 108 into the output capacitor C1, and the voltage appearing between the terminals of the piezoelectric device 108 is clipped at the 2Vf. However, as the electric charge is accumulated in the output capacitor C1, the voltage between the terminals of the output capacitor C1 increases. Then, subsequently, the electric charge flows in from the piezoelectric device 108 only after the voltage between terminals of the output capacitor C1 becomes a higher voltage than the sum of the VC1 and the 2Vf. Accordingly, the value at which the voltage between the terminals of the piezoelectric device 108 is clipped gradually rises as the electric charge is accumulated in the output capacitor C1.

In addition, as described above using FIGS. 3A to 4F, unless the electric charge flows from the piezoelectric device 108, at each time when the piezoelectric device 108 (exactly, the beam 104) is deformed, the electric charge within the piezoelectric device 108 increases and the voltage between the terminals of the piezoelectric device 108 becomes larger. On this account, according to the power-generating apparatus 100 of the embodiment, power can be generated under the condition that the voltage is naturally raised to the necessary voltage for driving of the electric load without a special step-up circuit.

A-4. Switching Timing of Switch of Embodiment

As explained above, in the power-generating apparatus 100 of the embodiment, the piezoelectric device 108 (exactly, the beam 104) is repeatedly deformed and the piezoelectric device 108 is connected to the inductor L in the time as the half of the resonance period at the moment when the deformation direction is switched, and thereby, an advantageous feature of good efficiency and easy downsizing because the step-up circuit is unnecessary may be obtained. However, turning the switch SW1 ON at the moment when the deformation direction of the beam 104 is switched is not so easy. For example, assuming that the magnitude of the deformation of the beam 104 is the maximum at the moment when the deformation direction of the beam 104 is switched, the switch may be adapted to be turned ON at the moment when the beam 104 is deformed to the maximum using a mechanical contact point. However, if the adjustment of the contact point shifts, the efficiency largely becomes lower. Accordingly, in the power-generating apparatus 100 of the embodiment, not only the piezoelectric device 108 for power generation but also the piezoelectric device 110 used for control are provided and the voltage generated in the piezoelectric device 110 is detected for control of the switch SW1.

FIGS. 5A to 5C are explanatory diagrams showing a reason why the switch SW1 can be controlled at appropriate times by detecting the voltage generated in the piezoelectric device 110 used for control. FIG. 5A shows displacement of the beam 104. Further, FIG. 5B shows changes of the electromotive force Vpzt generated in the piezoelectric device 110 with vibration of the beam 104.

As described above using FIGS. 3A to 4F, when the switch SW1 is turned ON at the time when the displacement u of the beam 104 reaches an extreme value, power may be generated most efficiently. Further, as clearly known from comparison between FIGS. 5A and 5B, the time when the displacement u of the beam 104 takes the extreme value coincides with the time when the electromotive force Vpzt of the piezoelectric device 110 takes an extreme value. This is for the following reason. First, even when the piezoelectric device 108 is deformed and electric charge is generated, the electric charge is extracted by the inductor L and the electric charge flows to the output capacitor C1, and thus, the electromotive force Vpzt of the piezoelectric device 108 does not become completely equal to the displacement of the beam 104. On the other hand, the piezoelectric device 110 is not connected to the inductor L or the output capacitor C1, and thus, the increase and decrease of the electric charge is directly reflected in the change of the electromotive force Vpzt of the piezoelectric device 110. Accordingly, the time when the electromotive force Vpzt of the piezoelectric device 110 takes an extreme value coincides with the time when the displacement u of the beam 104 takes an extreme value.

Therefore, as shown by arrows in FIG. 5B, by detecting the times when the electromotive force Vpzt of the piezoelectric device 110 takes an extreme value and turning the switch SW1 ON for the above described time as the half of the resonance period (T/2), power can be efficiently generated.

In the above description, efficient power generation by turning the switch SW1 ON at the above described times has been explained. In the power-generating apparatus 100 of the embodiment, the amount of deformation of the beam 104 can be suppressed by turning the switch SW1 ON at the other times that will be explained as below than the above described times.

Figure 6:
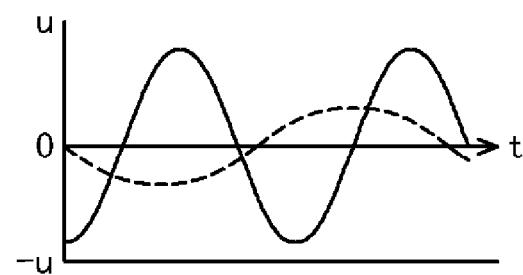
FIG. 6 is an explanatory diagram showing displacement of a beam when vibration is applied to the beam.

FIG. 6 is an explanatory diagram showing displacement of the beam 104 when vibration is applied to the beam 104 (corresponding to "amount of deformation" according to the invention), and shows changes of the displacement u of the end of the beam 104. The solid line in FIG. 6 shows displacement of the beam 104 (and the piezoelectric device 108) when the switch SW1 is OFF, a broken line shows displacement of the beam 104 (and the piezoelectric device 108) when the switch SW1 is ON, that is, when the upper electrode 109a and the lower electrode 109b of the piezoelectric device 108 are short-circuited. Note that, when the switch SW1 is OFF (solid line) and when the switch SW1 is ON (broken line) in FIG. 6, equal forces to each other are applied to the beams 104. As clearly known from the comparison between the broken line and the solid line in FIG. 6, the deformation of the beam 104 (and the piezoelectric device 108) is suppressed more when the switch SW1 is ON and the upper electrode 109a and the lower electrode 109b of the piezoelectric device 108 are short-circuited than when the switch SW1 is OFF.

In the power-generating apparatus 100 of the embodiment, the piezoelectric device 110 controls the amount of deformation of the beam 104 (and the piezoelectric device 108) using the property of the piezoelectric device 108. That is, the piezoelectric device 110 for control is provided on the beam 104 and they are deformed to similar extents, and thus, the larger the amount of deformation of the beam 104, the larger the absolute value of the voltage Vpzt generated in the piezoelectric device 110. Further, when the absolute value of the voltage Vpzt becomes equal to or more than a predetermined value (equal to or more than a limit voltage V1, which will be described later), the switch SW1 is turned ON and the upper electrode 109a and the lower electrode 109b of the piezoelectric device 108 for power generation are short-circuited, and thereby, the deformation of the piezoelectric device 108 (and the beam 104) more than a predetermined amount of deformation is suppressed.

FIGS. 7A to 7C are explanatory diagrams showing suppression of the deformation of the piezoelectric device 108 (and the beam 104) by short-circuiting when the voltage generated in the piezoelectric device 110 for control is equal to or more than a predetermined value. FIG. 7A shows displacement of the beam 104. Further, FIG. 7B shows changes of the voltage Vpzt generated in the piezoelectric device 110 with vibration of the beam 104. As shown in FIG. 7B, the voltage Vpzt generated in the piezoelectric device 110 reaches a predetermined value (limit voltage Vl) at time tl. The time tl is a time when the displacement of the beam 104 takes a fixed or larger value as shown in FIG. 7A. Further, as shown in FIG. 7C, the switch SW1 is turned ON and the upper electrode 109a and the lower electrode 109b of the piezoelectric device 108 for power generation are short-circuited at the time tl, and thereby, the deformation of the piezoelectric device 108 (and the beam 104) is suppressed. That is, unless the switch SW1 is turned ON, it would have deformed more largely as shown by a broken line in FIG. 7A, however, the switch SW1 is turned ON and the deformation of the piezoelectric device 108 (and the beam 104) is suppressed to the degree shown by a solid line.

In the above described manner, the amount of deformation of the beam 104 may be controlled, and thus, the beam 104 may be prevented from colliding with the members arranged around the beam 104 and a casing. As a result, it is not necessary to provide a buffer member for buffering the impact of the collision and the power-generating apparatus 100 can be downsized.

Figure 8:
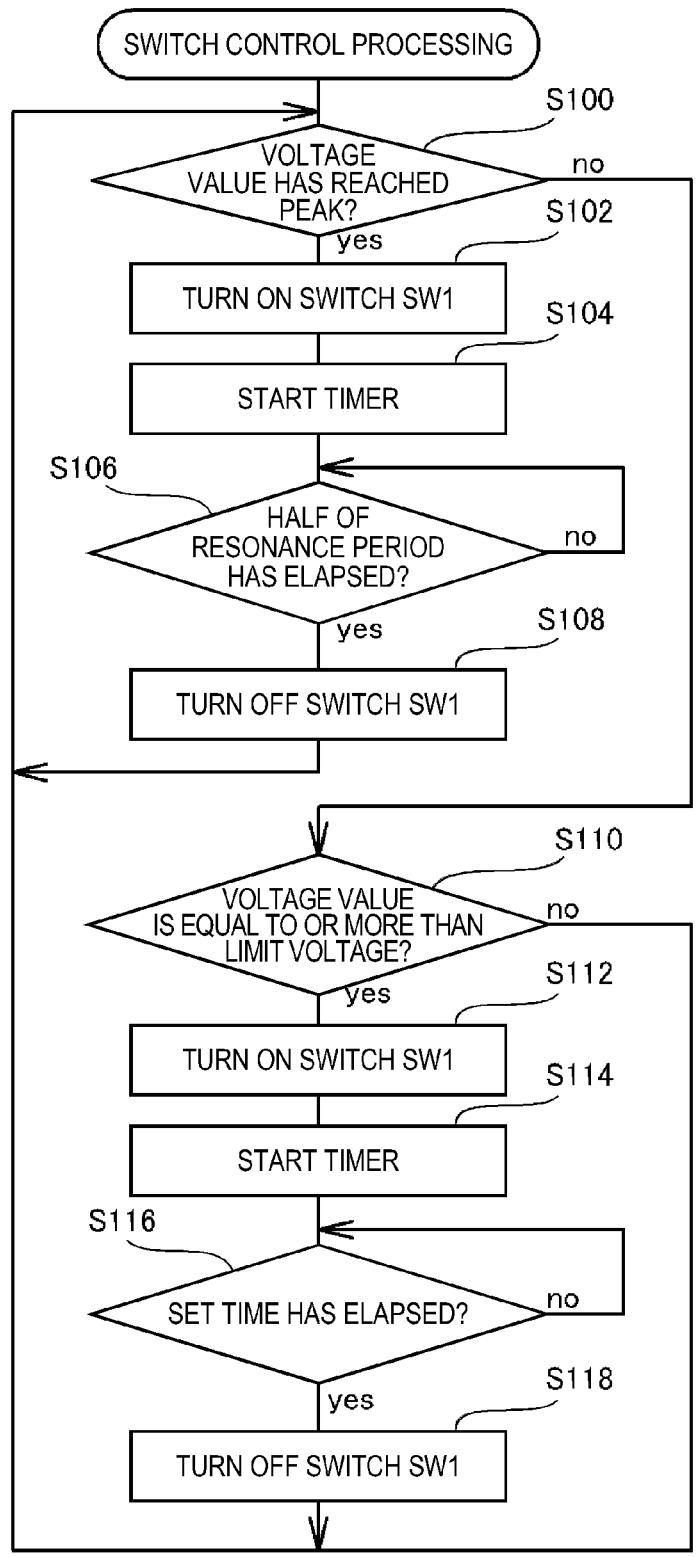
FIG. 8 is a flowchart showing switch control processing of switching ON/OFF of the switch by detecting the voltage of the piezoelectric device used for control.

FIG. 8 is a flowchart showing switch control processing of switching ON/OFF of the switch SW1 by detecting the voltage generated in the piezoelectric device 110 for control. This processing is executed by a CPU built in the control circuit 112. That is, the piezoelectric device 110 for control and the CPU of the control circuit 112 correspond to "amount of deformation detection unit". Further, the CPU of the control circuit 112 corresponds to "voltage detection unit".

When the switch control processing is started, the CPU of the control circuit 112 detects a voltage between upper electrode 111a and the lower electrode 111b of the piezoelectric device 110 for control and determines whether or not the voltage value has reached a peak (that is, whether or not the voltage value has reached an extreme value) (step S100). Regarding whether or not the voltage value has reached a peak, a determination that the voltage value has reached a peak may be made if the sign of the differential value obtained by differentiation of the voltage waveform changes.

If the peak of the voltage value generated in the piezoelectric device 110 for control is detected (S100: yes), the switch SW1 of the resonance circuit (the resonance circuit including the capacitance component Cg of the piezoelectric device 108 and the inductor L) is turned ON (step S102), and then, a timer (not shown) built in the control circuit 112 is started (step S104). Then, whether or not a time of a half of the resonance period of the resonance circuit including the capacitance component Cg of the piezoelectric device 108 and the inductor L has elapsed is determined (step S106).

As a result, if a determination that the time of the half of the resonance period of the resonance circuit has not elapsed (step S106: no), the same determination is repeated under the same condition, and a standby state is held until the time of the half of the resonance period has elapsed. If a determination that the time of the half of the resonance period of the resonance circuit has elapsed (step S106: yes), the switch SW1 of the resonance circuit is turned OFF (step S108).

By tuning ON/OFF of the switch SW1 of the resonance circuit by performing the processing at steps S100 to S108, the switch SW1 may be turned ON/OFF at appropriate times according to the movement of the beam 104, and power can efficiently be generated. When the switch SW1 of the resonance circuit is turned OFF (step S108), the process returns to the beginning of the switch control processing, and the above described series of processing is repeated.

If the peak of the voltage value generated in the piezoelectric device 110 for control is not detected in the processing at step S100 (step S100: no), then, whether or not the voltage value generated in the piezoelectric device 110 for control has reached the limit voltage V1 is determined (step S110). As a result, if the voltage value has reached the limit voltage V1 (step S110: yes), the switch SW1 is turned ON to short-circuit the upper electrode 109a and the lower electrode 109b for suppression of the deformation of the beam 104 (step S112). Then, the timer built in the control circuit 112 is started (S114). Then, whether or not a set time (corresponding to "predetermined time" according to the invention) has elapsed is determined (step S116). Here, the set time is a time for short-circuiting the upper electrode 109a and the lower electrode 109b for suppression of the deformation of the beam 104. For the length of the set time, for example, a time that can sufficiently suppress the deformation of the beam 104 of about a half of the vibration period of the beam 104 is set.

In the determination processing at step S116, if the set time has not elapsed (step S116: no), the same determination is repeated under the same condition, and a standby state is held until the set time has elapsed. If a determination that the set time has elapsed (step S116: yes), the switch SW1 is turned OFF (step S118). If the switch SW1 is turned OFF or the voltage value generated in the piezoelectric device 110 for control has not reached the limit voltage V1 (step S110: no), the process returns to the beginning of the switch control processing, and the above described series of processing is repeated.

By performing the processing at steps 110 to S118, if the voltage value generated in the piezoelectric device 110 for control has reached the limit voltage V1 (that is, the amount of deformation of the beam 104 is equal to or more than a predetermined amount), the upper electrode 109a and the lower electrode 109b are short-circuited for the set time, and the deformation of the beam 104 beyond the scope of the assumption may be suppressed. As a result, the beam 104 may be prevented from colliding with the members arranged around the beam 104 and the casing, and it is not necessary to provide a buffer member for buffering the impact of the collision and the power-generating apparatus 100 can be downsized.

Further, by controlling the times when one switch SW1 is turned ON, power can efficiently be generated (steps S100 to S108) and the amount of deformation of the beam 104 can be suppressed (steps S110 to S118). That is, the switch SW1 provided for efficient power generation is also used for suppression of the amount of deformation of the beam 104, and thus, increase of the number of members forming the power-generating apparatus 100 can be suppressed.

B. First Modified Example

There are various modified example of the above described embodiment. As below, the first modified example will briefly be explained.

In the power-generating apparatus 100 of the above described embodiment, one piezoelectric device 108 for power generation and one piezoelectric device 110 for control have been provided. However, these piezoelectric devices 108, 110 are not necessarily only ones, but pluralities of them may be provided. As below, the first modified example will be explained. Note that the same numbers are assigned to the same configurations as those of the above described embodiment in the modified example, and their detailed explanation will be omitted.

Figures 9A, 9B:
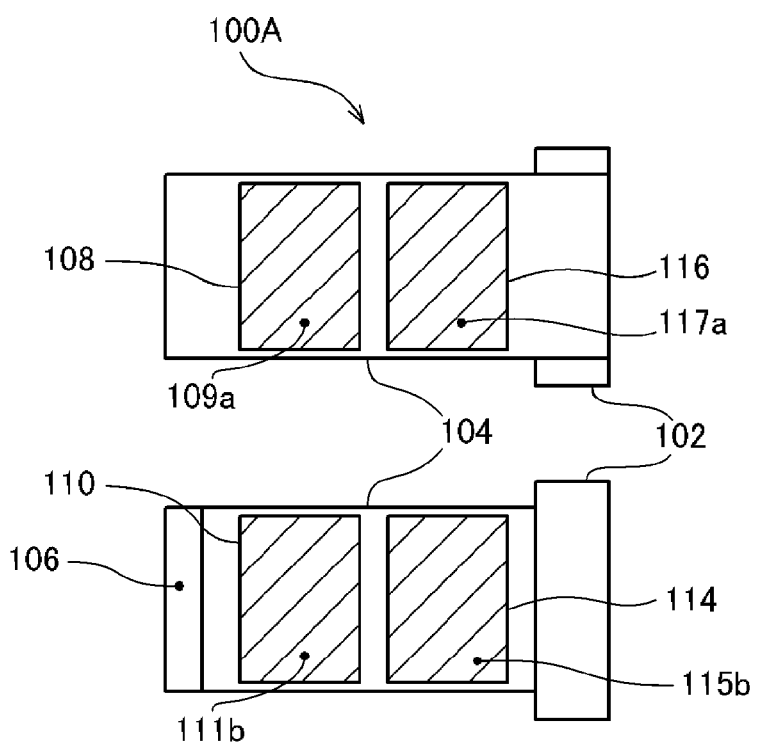
FIGS. 9A and 9B are explanatory diagrams showing arrangement of a piezoelectric device of a power-generating apparatus of a first modified example.

FIGS. 9A and 9B are explanatory diagrams showing power-generating apparatus 100A of the first modified example including pluralities of piezoelectric devices for power generation and piezoelectric devices for control. FIG. 9A is a plan view as seen from one surface of the beam 104. FIG. 9B is a plan view as seen from the other surface of the beam 104. FIG. 9A shows two piezoelectric devices for power generation (a piezoelectric device 108 and a piezoelectric device 116) provided on the one surface of the beam 104, and FIG. 9B shows two piezoelectric devices for control (a piezoelectric device 118 and a piezoelectric device 114) provided on the other surface of the beam 104. As shown in FIG.

9A, the piezoelectric devices 108, 116 for power generation are arranged side by side in the longitudinal direction of the beam 104 on the one surface of the beam 104. Further, as clearly known from the comparison between FIGS. 9A and 9B, for the piezoelectric device 108 for power generation, the piezoelectric device 110 for control is provided in a position opposed with the beam 104 in between, and, for the piezoelectric device 116 for power generation, the piezoelectric device 114 for control is provided in a position opposed with the beam 104 in between. Note that, for the piezoelectric device 116 for power generation and the piezoelectric device 114 for control, like the piezoelectric device 108 for power generation and the piezoelectric device 110 for control, upper electrodes 117a, 115a and lower electrodes 117b, 115b formed by metal thin films are provided.

Figure 10:
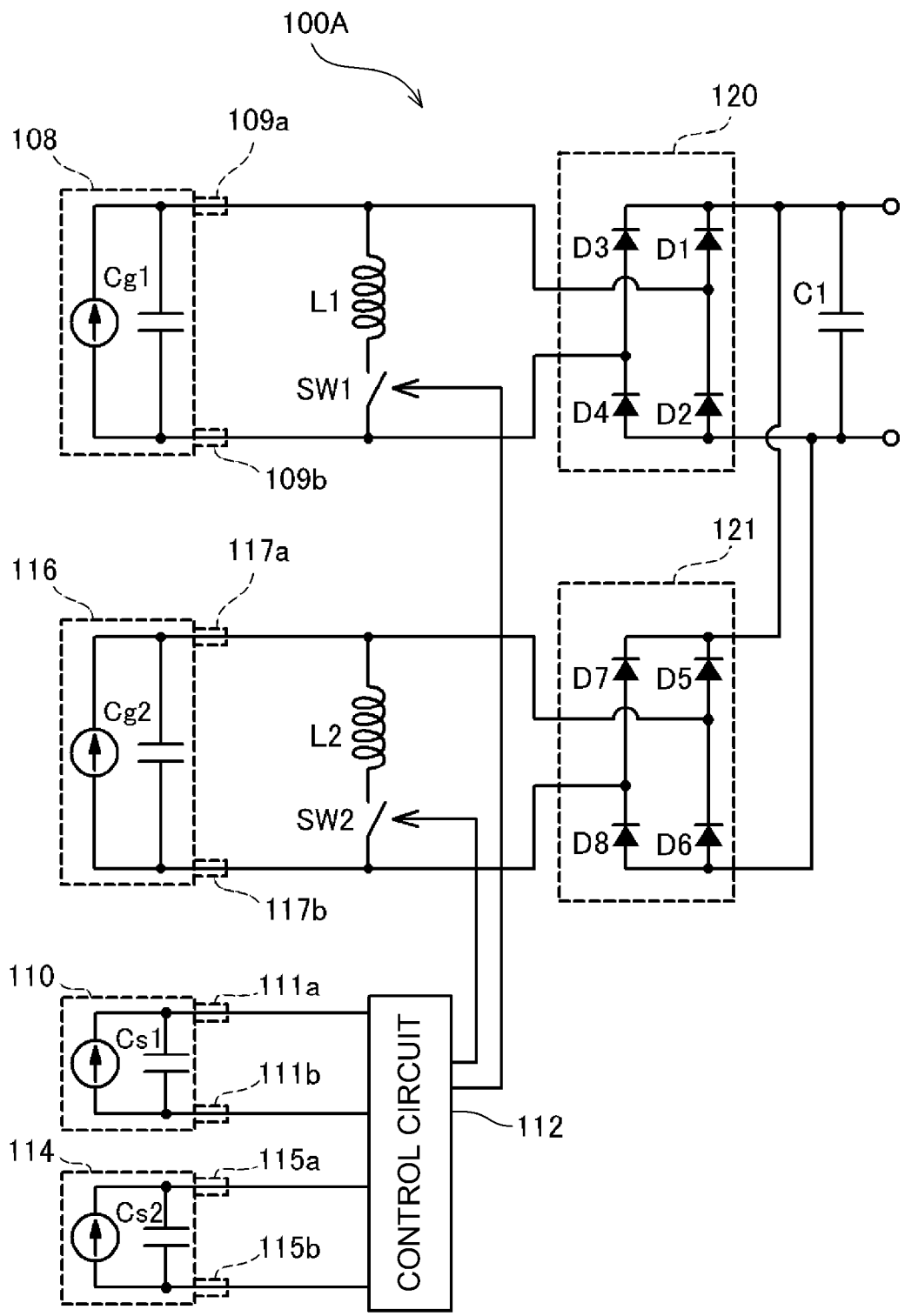
FIG. 10 is an explanatory diagram showing an electric structure of the power-generating apparatus of the first modified example.

FIG. 10 is an explanatory diagram showing an electric structure of the power-generating apparatus 100A of the first modified example including the two piezoelectric devices 108, 116 for power generation and the two piezoelectric devices 110, 114 for control. As clearly known from comparison between FIG. 10 and FIG. 1B, in the power-generating apparatus 100A of the first modified example, the piezoelectric device 116 for power generation, an inductor L2, a switch SW2, a full-wave rectifier circuit 121, and the piezoelectric device 114 for control, etc. are added to the above described embodiment. The additional configurations operate similarly to the piezoelectric device 108 for power generation, the inductor L1, the switch SW1, the full-wave rectifier circuit 120, and the piezoelectric device 110 for control, etc. explained in the above described embodiment.

That is, the switch SW1 is ON from when the voltage generated in the piezoelectric device 110 for control takes a peak value to when a time of a half of the resonance period elapses, and thus, the electric charge generated in the piezoelectric device 108 for power generation is efficiently accumulated in the output capacitor C1. Similarly, the switch SW2 is ON from when the voltage generated in the piezoelectric device 114 for control takes a peak value to when a time of a half of the resonance period elapses, and thus, the electric charge generated in the piezoelectric device 116 for power generation is also accumulated in the output capacitor C1.

Further, the switch SW1 is ON from when the voltage generated in the piezoelectric device 110 for control is equal to or more than a limit voltage V1 to when a set time of elapses, and thus, the deformation of the piezoelectric device 108 for power generation is suppressed. Similarly, the switch SW2 is ON from when the voltage generated in the piezoelectric device 114 for control is equal to or more than the limit voltage V1 to when the set time of elapses, and thus, the deformation of the piezoelectric device 116 for power generation is suppressed. By respectively suppressing the deformations of the piezoelectric devices 108, 116, deformations of the separate parts of the beam 104 on which the piezoelectric devices 108, 116 are formed (see FIG. 7) may be respectively suppressed. In this manner, the deformations of the separate parts of the beam 104 are respectively suppressed, and, even when an excessive deformation is generated in only one part of the separate parts of the beam 104, power can be generated while the deformation of the only one part is suppressed but the deformation of the other part is not suppressed. Therefore, power can be generated efficiently while an excessive deformation is suppressed according to various deformations of the beam 104.

C. Second Modified Example

Next, a second modified example will briefly be explained.

Figure 11:
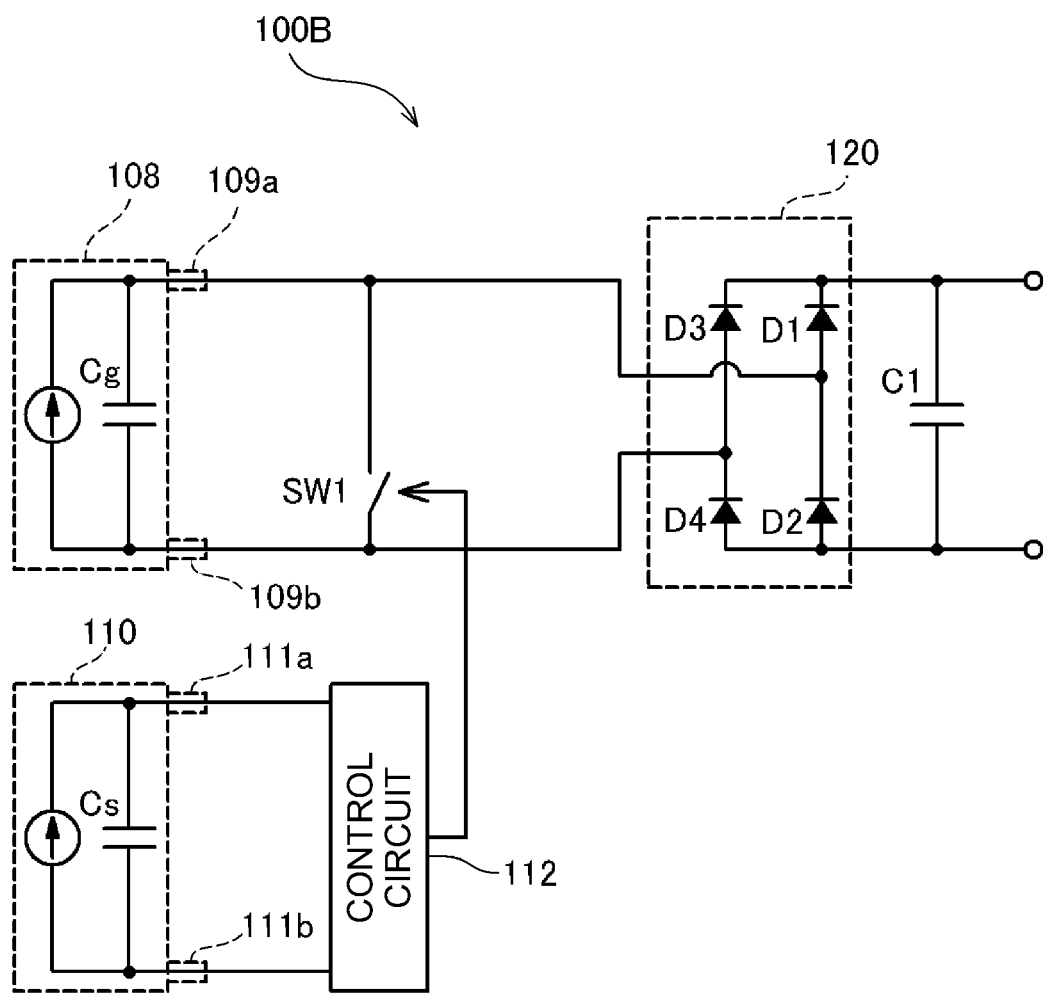
FIG. 11 is an explanatory diagram showing an electric structure of a power-generating apparatus of a second modified example.

FIG. 11 is an explanatory diagram showing an electric structure of a power-generating apparatus 100B of the second modified example. As clearly known from comparison between FIG. 11 and FIG. 1B, in the power-generating apparatus 100B of the second modified example, compared to the above described embodiment, the inductor L1 is not connected. That is, the LC resonance circuit like that in the above described embodiment is not formed within the power-generating apparatus 100B of the second modified example. Thereby, control processing (S100 to S108 in FIG. 8) for using the LC resonance circuit executed by the CPU built in the control circuit 112 may be omitted.

Obviously, the power-generating apparatus 100B of the second modified example does not use the LC resonance circuit unlike the power-generating apparatus 100 of the above described embodiment and the more effective accumulation of electric charge may not be expected than the power-generating apparatus 100. However, by performing processing of turning the switch SW1 ON when the amount of deformation of the beam 104 is equal to or more than a predetermined value (S110 to S118 in FIG. 8), the deformation of the beam 104 may be suppressed. As described above, the power-generating apparatus 100B of the second modified example may suppress increase of the number of members (the inductor L1) and the processing load of the CPU (control processing for using the LC resonance circuit) and prevent the beam 104 from colliding with the members arranged around the beam 104 and the casing.

As above, the embodiment or the modified examples have been explained, however, the invention is not limited to the embodiment or the modified example and can be implemented in various forms without departing from the scope thereof.

For example, in the above described embodiment, the explanation that the switch SW1 is turned ON at the times when the deformation direction of the beam 104 is switched and electric charge is efficiently accumulated in the output capacitor C1 has been made. However, not limited to that, electric charge may be accumulated in the output capacitor C1 with the switch SW1 shown in FIG. 2B held OFF. That is, any configuration may be employed as long as it may accumulate the electric charge generated in the piezoelectric device 108.

Further, in the above described embodiment, the explanation that the piezoelectric device 108 is attached to the beam 104 having the cantilever structure has been made. However, the member to which the piezoelectric device 108, the piezoelectric device 110, etc. are attached may have any structure and shape as long as the member may easily and repeatedly be deformed due to vibration or the like and may be a beam having a structure supported at both ends. For example, the piezoelectric device 108 and the piezoelectric device 110 may be attached to a surface of a thin film.

Furthermore, since the power-generating apparatus according to the invention generates power according to vibration and movement, for example, if the power-generating apparatus is provided on a bridge, a building, or a location where landslide is envisioned, power may be generated in a time of disaster such as earthquake and supplied to network means such as an electronic device only when needed (when a disaster occurs).

Note that, since the power-generating apparatus according to the invention can be downsized, the apparatus may be provided not only in the electronic device but also in various devices. For example, using the power-generating apparatus according to the invention for a transportation device such as a vehicle or train, power may be generated by vibration with transportation and efficiently supplied to devices of the transportation device.

This application claims priority to Japanese Patent Application No. 2011-031718, filed on Feb. 17, 2011, the entirety of which is hereby incorporated by reference.

What is claimed is:

1. A power-generating apparatus comprising:
   a deformation member that is provided with a first piezoelectric device and deformed while switching a deformation direction;
   an amount of deformation detection unit that detects an amount of deformation of the deformation member;
   a pair of electrodes provided on the first piezoelectric device;
   a switch provided between the pair of electrodes; and
   a switch control unit that controls the switch to cause short-circuit between the pair of electrodes for a predetermined period when the amount of deformation is equal to or more than a predetermined amount,
   wherein the amount of deformation detection unit includes:
   a second piezoelectric device provided on the deformation member and used for detection of the amount of deformation; and
   a voltage detection unit that detects a voltage generated in the second piezoelectric device.

2. The power-generating apparatus according to claim 1, further comprising an inductor that is provided between the pair of electrodes and series-connected to the switch to form a resonance circuit with a capacitance component of the first piezoelectric device,
   wherein the switch control unit is a unit that connects the switch when the deformation direction of the deformation member is switched, and then, disconnects the switch after a time corresponding to a half period of a resonance period of the resonance circuit has elapsed in a period in which the amount of deformation does not reach the predetermined amount.

3. The power-generating apparatus according to claim 2, wherein the second piezoelectric device is provided in a position opposed to the first piezoelectric device with the deformation member in between.

4. The power-generating apparatus according to claim 1, wherein pluralities of the first piezoelectric devices and the second piezoelectric devices are provided.

5. An electronic device comprising the power-generating apparatus according to claim 1.

6. An electronic device comprising the power-generating apparatus according to claim 2.

7. An electronic device comprising the power-generating apparatus according to claim 3.

8. An electronic device comprising the power-generating apparatus according to claim 4.

9. A transportation device comprising the power-generating apparatus according to claim 1.

10. A transportation device comprising the power-generating apparatus according to claim 2.

11. A transportation device comprising the power-generating apparatus according to claim 3.

12. A transportation device comprising the power-generating apparatus according to claim 4.

* * * * *